(12) United States Patent
Liu et al.

(10) Patent No.: US 12,165,961 B2
(45) Date of Patent: Dec. 10, 2024

(54) SEMICONDUCTOR PACKAGE STRUCTURE

(71) Applicant: MEDIATEK INC., Hsinchu (TW)

(72) Inventors: Hsing-Chih Liu, Hsinchu (TW); Zheng Zeng, San Jose, CA (US); Che-Hung Kuo, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/329,721

(22) Filed: Jun. 6, 2023

(65) Prior Publication Data

US 2023/0317580 A1 Oct. 5, 2023

Related U.S. Application Data

(63) Continuation of application No. 17/363,459, filed on Jun. 30, 2021, now Pat. No. 11,710,688.

(Continued)

(51) Int. Cl.
*H01L 23/498* (2006.01)
*H01L 23/31* (2006.01)
(Continued)

(52) U.S. Cl.
CPC .... *H01L 23/49811* (2013.01); *H01L 23/3128* (2013.01); *H01L 23/481* (2013.01);
(Continued)

(58) Field of Classification Search
CPC ........... H01L 23/49811; H01L 23/3128; H01L 23/481; H01L 23/5385; H01L 23/5389; H01L 25/0657; H01L 25/105
See application file for complete search history.

(56) References Cited

U.S. PATENT DOCUMENTS 11,710,688 B2 * 7/2023 Liu ................. H01L 25/105
257/773
2016/0049385 A1 2/2016 Yu et al.
(Continued)

FOREIGN PATENT DOCUMENTS

| CN | 110021564 A | 7/2019 |
|---|---|---|
| EP | 3511980 A1 | 7/2019 |
| TW | 201834083 A | 9/2018 |

OTHER PUBLICATIONS

Notice of Allowance dated Mar. 1, 2022 of its corresponding Taiwan patent application.

(Continued)

*Primary Examiner* — Fernando L Toledo
*Assistant Examiner* — Neil R Prasad
(74) *Attorney, Agent, or Firm* — McClure, Qualey & Rodack, LLP

(57) ABSTRACT

A semiconductor package structure having a frontside redistribution layer, a stacking structure disposed over the frontside redistribution layer and having a first semiconductor die and a second semiconductor die over the first semiconductor die. A backside redistribution layer is disposed over the stacking structure, a first intellectual property (IP) core is disposed in the stacking structure and electrically coupled to the frontside redistribution layer through a first routing channel. A second IP core is disposed in the stacking structure and is electrically coupled to the backside redistribution layer through a second routing channel, wherein the second routing channel is different from the first routing channel and electrically insulated from the frontside redistribution layer.

20 Claims, 7 Drawing Sheets

Related U.S. Application Data

(60) Provisional application No. 63/048,734, filed on Jul. 7, 2020.

(51) Int. Cl.
  *H01L 23/48* (2006.01)
  *H01L 23/538* (2006.01)
  *H01L 25/065* (2023.01)
  *H01L 25/10* (2006.01)

(52) U.S. Cl.
  CPC ...... *H01L 23/5385* (2013.01); *H01L 23/5389* (2013.01); *H01L 25/0657* (2013.01); *H01L 25/105* (2013.01)

(56) References Cited

U.S. PATENT DOCUMENTS

| | | |
|---|---|---|
| 2017/0053897 A1 | 2/2017 | Lai et al. |
| 2018/0005984 A1 | 1/2018 | Yu et al. |
| 2020/0357770 A1 | 11/2020 | Chiang et al. |
| 2020/0411445 A1 | 12/2020 | Chen et al. |
| 2021/0082888 A1 | 3/2021 | Lai et al. |

OTHER PUBLICATIONS

DE Office Action dated Jan. 12, 2023 in German application No. 102021117353.1.

* cited by examiner

SEMICONDUCTOR PACKAGE STRUCTURE

CROSS REFERENCE TO RELATED APPLICATIONS

This application is a Continuation of pending U.S. application Ser. No. 17/363,459, filed Jun. 30, 2021, which claims the benefit of U.S. Provisional Application No. 63/048,734 filed on Jul. 7, 2020, the entirety of which is incorporated by reference herein.

BACKGROUND OF THE INVENTION

Field of the Invention

The present invention is related to semiconductor packaging technology, and in particular to a semiconductor package structure.

Description of the Related Art

With the increasing demand for more functions and smaller devices, package-on-package (PoP) technology, which vertically stacks two or more packages, has become increasingly popular. The PoP technology minimizes track lengths between different components, such as a controller and a memory device. This provides better electrical performance, since shorter routing of interconnections yields faster signal propagation and reduced noise and cross-talk defects.

Although existing semiconductor package structures are generally adequate, they are not satisfactory in every respect. For example, it is challenging to fulfill the channel requirements for integrating different components in a package. Therefore, there is a need to further improve semiconductor package structures to provide flexibility in channel design.

BRIEF SUMMARY OF THE INVENTION

In accordance with some embodiments, a semiconductor package structure is provided. The semiconductor package structure includes a frontside redistribution layer, a stacking structure, a backside redistribution layer, a first intellectual property (IP) core, and a second IP core. The stacking structure is disposed over the frontside redistribution layer and comprises a first semiconductor die and a second semiconductor die over the first semiconductor die. The backside redistribution layer is disposed over the stacking structure. The first IP core is disposed in the stacking structure and is electrically coupled to the frontside redistribution layer through a first routing channel. The second IP core is disposed in the stacking structure and is electrically coupled to the backside redistribution layer through a second routing channel, wherein the second routing channel is separated from the first routing channel and electrically insulated from the frontside redistribution layer.

In accordance with some embodiments, a semiconductor routing structure is provided. The semiconductor routing structure includes a first package structure, a first routing channel, and a second routing channel. The first package structure has a frontside and a backside and comprises a stacking structure which has a first intellectual property (IP) core and a second IP core. The first routing channel electrically couples the first IP core to a first redistribution layer on the frontside of the first package structure. The second routing channel independently and electrically couples the second IP core to a second redistribution layer on the backside of the first package structure, wherein the second routing channel is separated from the first routing channel and electrically insulated from the first redistribution layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
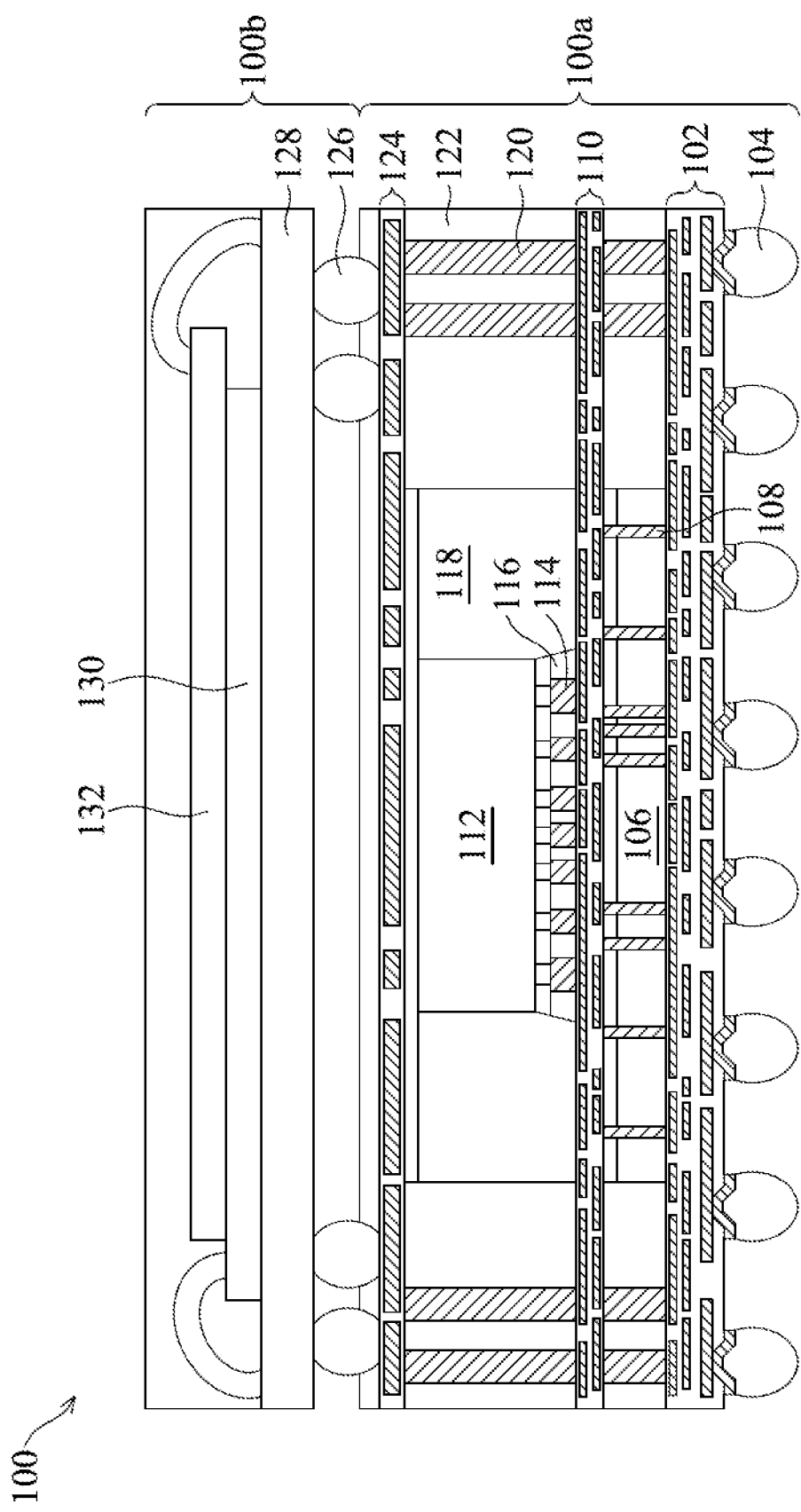
FIG. 1 is a cross-sectional view of an exemplary semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

A semiconductor package structure and a semiconductor routing structure are described in accordance with some embodiments of the present disclosure. The semiconductor package structure provides an individual routing channel for a device and an IP core, such as a memory device and a memory IP core, so that the flexibility of routing channel design can be elevated.

FIG. 1 is a cross-sectional view of a semiconductor package structure 100 in accordance with some embodiments of the disclosure. Additional features can be added to the semiconductor package structure 100. Some of the features described below can be replaced or eliminated for different embodiments. To simplify the diagram, only a portion of the semiconductor package structure 100 is illustrated.

As shown in FIG. 1, the semiconductor package structure 100 includes a first package structure 100a and a second package structure 100b stacked vertically, in accordance with some embodiments. The first package structure 100a has a frontside and a backside opposite to the frontside. The first package structure 100a may have a first redistribution layer 102 on the frontside and a second redistribution layer 124 on the backside. Therefore, the first redistribution layer 102 may be also referred to as the frontside redistribution layer 102, and the second redistribution layer 124 may be also referred to as the backside redistribution layer 124.

The first redistribution layer 102 may include one or more conductive layers and passivation layers, wherein the one or more conductive layers may be disposed in the one or more passivation layers. The conductive layers may include metal, such as copper, titanium, tungsten, aluminum, the like, or a combination thereof. In some embodiments, the passivation layers include a polymer layer, for example, polyimide (PI), polybenzoxazole (PBO), benzocyclobutene (BCB), epoxy, the like, or a combination thereof. Alternatively, the passivation layers may include a dielectric layer, such as silicon oxide, silicon nitride, silicon oxynitride, the like, or a combination thereof. The material of the second redistribution layer 124 may be similar to the material of the first redistribution layer 102, and will not be repeated.

As shown in FIG. 1, the first redistribution layer 102 includes more conductive layers and passivation layers than the second redistribution layer 124 in accordance with some embodiments. The first redistribution layer 102 may be thicker than the second redistribution layer 124, but the present disclosure is not limit thereto. For example, the second redistribution layer 124 may be thicker than or substantially equal to the first redistribution layer 102.

In some embodiments, the first package structure 100a includes a plurality of conductive structures 104 below the first redistribution layer 102 and electrically coupled to the first redistribution layer 102. In some embodiments, the conductive structures 104 include conductive materials, such as metal. The conductive structures 104 may include microbumps, controlled collapse chip connection (C4) bumps, ball grid array (BGA) balls, the like, or a combination thereof.

In some embodiments, the first package structure 100a includes a stacking structure which includes a first semiconductor die 106 and a second semiconductor die 112 stacked vertically over the first redistribution layer 102. According to some embodiments, the first semiconductor die 106 and the second semiconductor die 112 each independently includes a system-on-chip (SoC) die, a logic device, a memory device, a radio frequency (RF) device, the like, or any combination thereof. For example, the first semiconductor die 106 and the second semiconductor die 112 may each independently include a micro control unit (MCU) die, a microprocessor unit (MPU) die, a power management integrated circuit (PMIC) die, a global positioning system (GPS) device, a central processing unit (CPU) die, a graphics processing unit (GPU) die, an input-output (IO) die, a dynamic random access memory (DRAM) IP core, a static random-access memory (SRAM), a high bandwidth memory (HBM), the like, or any combination thereof.

Although two semiconductor dies, the first semiconductor die 106 and the second semiconductor die 112, are shown in FIG. 1, there may be more than two semiconductor dies. For example, the stacking structure may include three semiconductor dies stacked vertically. Alternatively, the stacking structure may include four semiconductor dies, wherein two of them are stacked vertically over a semiconductor die, and the other semiconductor die is disposed over the semiconductor die and adjacent to the two semiconductor dies. In some embodiments, the stacking structure also includes one or more passive components (not illustrated), such as resistors, capacitors, inductors, the like, or a combination thereof.

As shown in FIG. 1, the first semiconductor die 106 includes a plurality of through vias 108, which are electrically coupled to the first redistribution layer 102. The through vias 108 may be formed of conductive material, such as a metal. For example, the through vias 108 may be formed of copper. As shown in FIG. 1, the through vias 108 have substantially vertical sidewalls and extend from the top surface of the first semiconductor die 106 to the bottom surface of the first semiconductor die 106, but the present disclosure is not limit thereto. The through vias 108 in the first semiconductor die 106 may have other configurations and numbers.

In some embodiments, the first package structure 100a includes a third redistribution layer 110 between the first redistribution layer 102 and the second redistribution layer 124. As shown in FIG. 1, the third redistribution layer 110 may be disposed between the top surface of the first semiconductor die 106 and the bottom surface of the second semiconductor die 112, and may extend beyond the sidewalls of the first semiconductor die 106 and the sidewalls of the second semiconductor die 112. The third redistribution layer 110 may be electrically coupled to the first semiconductor die 106, the through vias 108 in the first semiconductor die 106, and the second semiconductor die 112.

The material of the third redistribution layer 110 may be similar to the material of the first redistribution layer 102, and will not be repeated. As shown in FIG. 1, the first redistribution layer 102 includes more conductive layers and passivation layers than the third redistribution layer 110, and the third redistribution layer 110 includes more conductive layers and passivation layers than the second redistribution layer 124, but the present disclosure is not limit thereto. For example, the second redistribution layer 124 may include more conductive layers and passivation layers than the first redistribution layer 102 and the third redistribution layer 110.

By disposing the third redistribution layer 110, an additional routing channel can be formed between the first semiconductor die 106 and the second semiconductor die 112, which is help for floorplan flexibility and save die bump fanout width, as described below and shown in FIGS. 2A-2D.

Figure 2A:
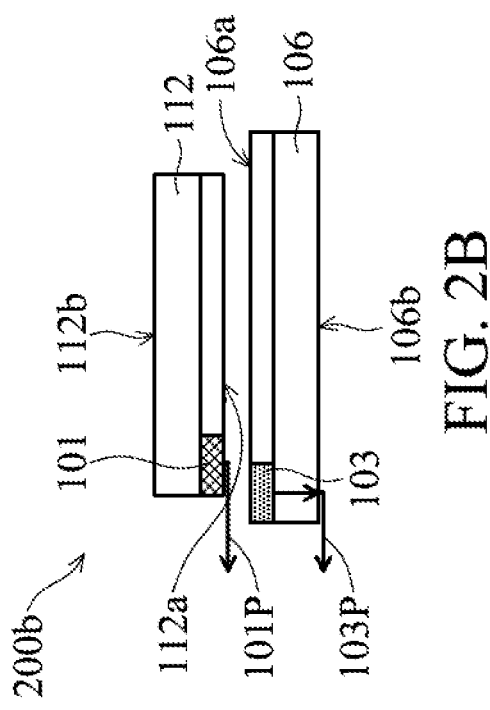
FIGS. 2A-2D are cross-sectional views of stacking structures in exemplary semiconductor package structures in accordance with some embodiments.

FIG. 2A is a cross-sectional view of a stacking structure 200a in the semiconductor package structure 100 in accordance with some embodiments. To simplify the diagram, only a portion of the stacking structure 200a is illustrated. In some embodiments, the stacking structure 200a includes the first semiconductor die 106 and the second semiconductor die 112.

The first semiconductor die 106 has an active surface 106a and a backside surface 106b opposite to the active surface 106a. The second semiconductor die 112 has an active surface 112a and a backside surface 112b opposite to the active surface 112a. The first semiconductor die 106 and the second semiconductor die 112 may be stacked face to face (FtF). That is, the active surface 112a of the second semiconductor die 112 is close to the active surface 106a of the first semiconductor die 106.

As shown in FIG. 2A, a first intellectual property (IP) core 101 and a second IP core 103 may be disposed on the active surface 106a of the first semiconductor die 106. In some embodiments, the first IP core 101 is used for control the second package structure 100b (as shown in FIG. 1), and the second IP core 103 is used for control the other component which is electrically coupled to the first redistribution layer 102.

According to some embodiments, since the third redistribution layer 110 is disposed between the first semiconductor die 106 and the second semiconductor die 112, an additional routing channel can be formed therebetween. As a result, the signal from the first IP core 101 and the signal from the second IP core 103 can pass through different routing channels, for example, as indicated by the path 101P and the path 103P, respectively. In particular, the routing channel of the first IP core 101 (indicated by the path 101P) may pass the third redistribution layer 110 (as shown in FIG. 1), and the routing channel of the second IP core 103 (indicated by the path 103P) may pass the through vias 108 in the first semiconductor die 106 and the first redistribution layer 102 (as shown in FIG. 1).

That is, in comparison with both of the routing channel for the first IP core 101 and the routing channel for the second IP core 103 pass through the first redistribution layer 102, individual routing channels for the first IP core 101 and the second IP core 103 can be provided in the present disclosure. In this way, these routing channels can be optimized separately to fulfill the different channel requirements. In addition, the routing channel for the first IP core 101 would not affect the routing channel for the second IP core 103, and thus the channel design flexibility can be increased.

As shown in FIG. 2A, the first IP core 101 and the second IP core 103 are separate and disposed side by side, but the present disclosure is not limit thereto. For example, the first IP core 101 may be placed in the second IP core 103 according to some other embodiments. Alternatively, the first IP core 101 and the second IP core 103 may be disposed adjacent to different edges of the first semiconductor die 102. In addition, there may be more than two IP cores.

Figure 2B:
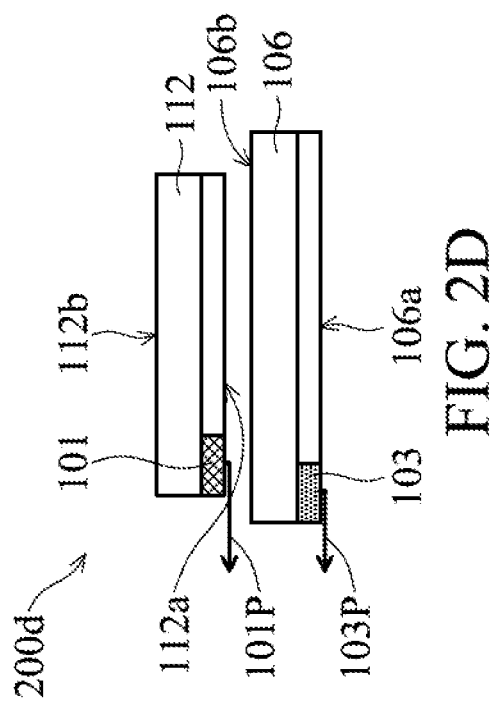

FIG. 2B is a cross-sectional view of a stacking structure 200b in the semiconductor package structure 100 in accordance with some embodiments. To simplify the diagram, only a portion of the stacking structure 200b is illustrated. The stacking structure 200b may include the same or similar components as that of the stacking structure 200a shown in FIG. 2A, and for the sake of simplicity, those components will not be discussed in detail again. In the following embodiments, the first IP core 101 is disposed on the active surface 112a of the second semiconductor die 112, and the second IP core 103 is disposed on the active surface 106a of the first semiconductor die 106.

As shown in FIG. 2B, the signal from the first IP core 101 and the signal from the second IP core 103 can pass through different routing channels, for example, as indicated by the path 101P and the path 103P, respectively. In particular, the routing channel of the first IP core 101 (indicated by the path 101P) may pass the third redistribution layer 110 (as shown in FIG. 1), and the routing channel of the second IP core 103 (indicated by the path 103P) may pass the through vias 108 in the first semiconductor die 106 and the first redistribution layer 102 (as shown in FIG. 1).

Figure 2C:
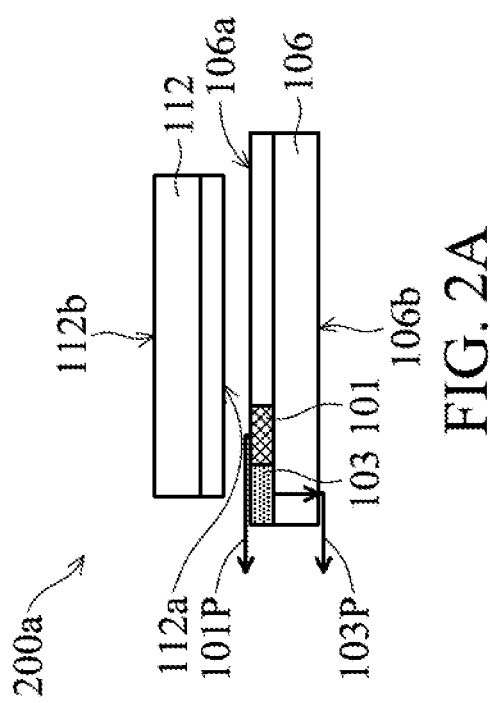

FIG. 2C is a cross-sectional view of a stacking structure 200c in the semiconductor package structure 100 in accordance with some embodiments. To simplify the diagram, only a portion of the stacking structure 200c is illustrated. The stacking structure 200c may include the same or similar components as that of the stacking structure 200a shown in FIG. 2A, and for the sake of simplicity, those components will not be discussed in detail again. In the following embodiments, the first semiconductor die 106 and the second semiconductor die 112 may be stacked face to back (FtB). That is, the active surface 112a of the second semiconductor die 112 is close to the backside surface 106b of the first semiconductor die 106.

As shown in FIG. 2C, the first IP core 101 and the second IP core 103 are disposed on the active surface 106a of the first semiconductor die 106. The signal from the first IP core 101 and the signal from the second IP core 103 can pass through different routing channels, for example, as indicated by the path 101P and the path 103P, respectively. In particular, the routing channel of the first IP core 101 (indicated by the path 101P) may pass the through vias 108 in the first semiconductor die 106 and the third redistribution layer 110 (as shown in FIG. 1), and the routing channel of the second IP core 103 (indicated by the path 103P) may pass the first redistribution layer 102 (as shown in FIG. 1).

Figure 2D:
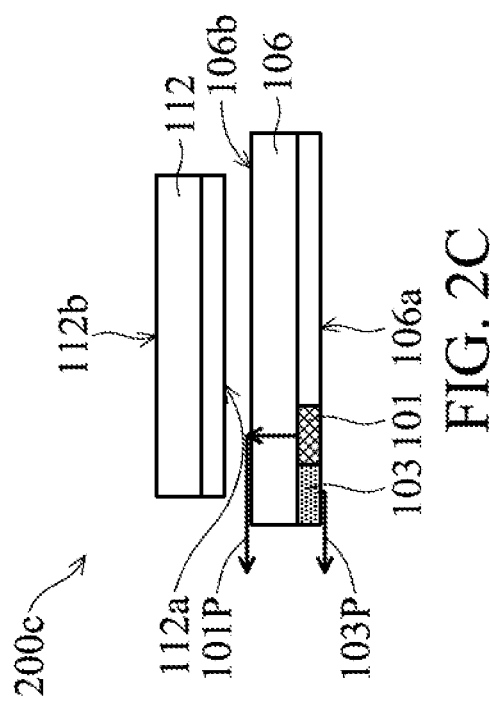

FIG. 2D is a cross-sectional view of a stacking structure 200d in the semiconductor package structure 100 in accordance with some embodiments. To simplify the diagram, only a portion of the stacking structure 200d is illustrated. The stacking structure 200d may include the same or similar components as that of the stacking structure 200a shown in FIG. 2A, and for the sake of simplicity, those components will not be discussed in detail again. In the following embodiments, the first IP core 101 is disposed on the active surface 112a of the second semiconductor die 112, and the second IP core 103 is disposed on the active surface 106a of the first semiconductor die 106.

As shown in FIG. 2D, the signal from the first IP core 101 and the signal from the second IP core 103 can pass through different routing channels, for example, as indicated by the path 101P and the path 103P, respectively. In particular, the routing channel of the first IP core 101 (indicated by the path 101P) may pass the third redistribution layer 110 (as shown in FIG. 1), and the routing channel of the second IP core 103 (indicated by the path 103P) may pass through the first redistribution layer 102 (as shown in FIG. 1).

Referring back to FIG. 1, a plurality of conductive structures 114 are formed between the third redistribution layer 110 and the second semiconductor die 112, according to some embodiments. The conductive structures 114 may electrically couples the second semiconductor die 112 to the third redistribution layer 110. Depending on the routing channel design and the positions of the IP cores, the routing channel may also include the conductive structures 114.

In some embodiments, the conductive structures 114 include conductive materials, such as metal. The conductive structures 114 may include microbumps, controlled collapse chip connection (C4) bumps, ball grid array (BGA) balls, the like, or a combination thereof.

In some embodiments, an underfill material 116 is formed between the second semiconductor die 112 and the third redistribution layer 110, and fills in gaps between the conductive structures 114 to provide structural support. The underfill material 116 may surround each of the conductive structures 114. In some embodiments, the underfill material 116 is formed of polymer, such as epoxy. The underfill material 116 may be dispensed with capillary force after the conductive structures 114 are formed between the second semiconductor die 112 and the third redistribution layer 110. Then, the underfill material 116 may be cured through any suitable curing process.

As shown in FIG. 1, the first package structure 100a includes a molding material 118 surrounding the second semiconductor die 112 and the underfill material 116, and covering a portion of the top surface of the third redistribution layer 110. In some embodiments, the molding material 118 adjoins the sidewalls of the second semiconductor die 112 and the top surface of the third redistribution layer 110. The molding material 118 may protect the second semiconductor die 112 from the environment, thereby preventing the second semiconductor die 112 from damage due to, for example, the stress, the chemicals and/or the moisture.

The molding material 118 may include a nonconductive material, such as a moldable polymer, an epoxy, a resin, the like, or a combination thereof. In some embodiments, the molding material 118 is applied in liquid or semi-liquid form, and then is cured through any suitable curing process, such as a thermal curing process, a UV curing process, the like, or a combination thereof. The molding material 118 may be shaped or molded with a mold (not shown).

Then, the molding material 118 may be partially removed by a planarization process, such as chemical mechanical polishing (CMP), until the top surface of the second semiconductor die 112 is exposed. In some embodiments, the top surface of the molding material 118 and the top surface of the second semiconductor die 112 are substantially coplanar. As shown in FIG. 1, the sidewalls of the molding material 118 may be coplanar with the sidewalls of the first semiconductor die 106.

In some embodiments, a plurality of conductive pillars 120 are formed adjacent to the stacking structure (including the first semiconductor die 106 and the second semiconductor die 112) and the molding material 118. The conductive pillars 120 may include metal pillars, such as copper pillars. In some embodiments, the conductive pillars 120 are formed by a plating process or any other suitable process. As shown in FIG. 1, the conductive pillars 120 may have substantially vertical sidewalls.

As shown in FIG. 1, the conductive pillars 120 may be disposed between the first redistribution layer 102 and the second redistribution layer 124, and may be disposed on the top surface and the bottom surface of the third redistribution layer 110. The conductive pillars 120 may be electrically coupled to the first redistribution layer 102, the second redistribution layer 124, and the third redistribution layer 110.

The positions and the numbers of the conductive pillars 120 may be adjusted according to the routing design of the first package structure 100a. For example, in some other embodiments, the conductive pillars 120 are disposed between the second redistribution layer 124 and the third redistribution layer 110, and are not disposed between the first redistribution layer 102 and the third redistribution layer 110. In these embodiments, the second redistribution layer 124 is electrically coupled to the third redistribution layer 110 through the conductive pillars 120, and the third redistribution layer 110 is electrically coupled to the first redistribution layer 102 through the through vias 108 in the first semiconductor die 106.

As shown in FIG. 1, four conductive pillars 120 are disposed on opposite sides of the stacking structure, but the present disclosure is not limit thereto. For example, the number of conductive pillars 120 may be different on opposite sides of the stacking structure. Alternatively, the conductive pillars 120 may be disposed on one side of the stacking structure.

As shown in FIG. 1, the first package structure 100a includes a molding material 122 surrounding the stacking structure (including the first semiconductor die 106 and the second semiconductor die 112), the molding material 118, and the conductive pillars 120. The molding material 122 may fill in gaps between the conductive pillars 120, and between the stacking structure and the conductive pillars 120.

Figure 3:
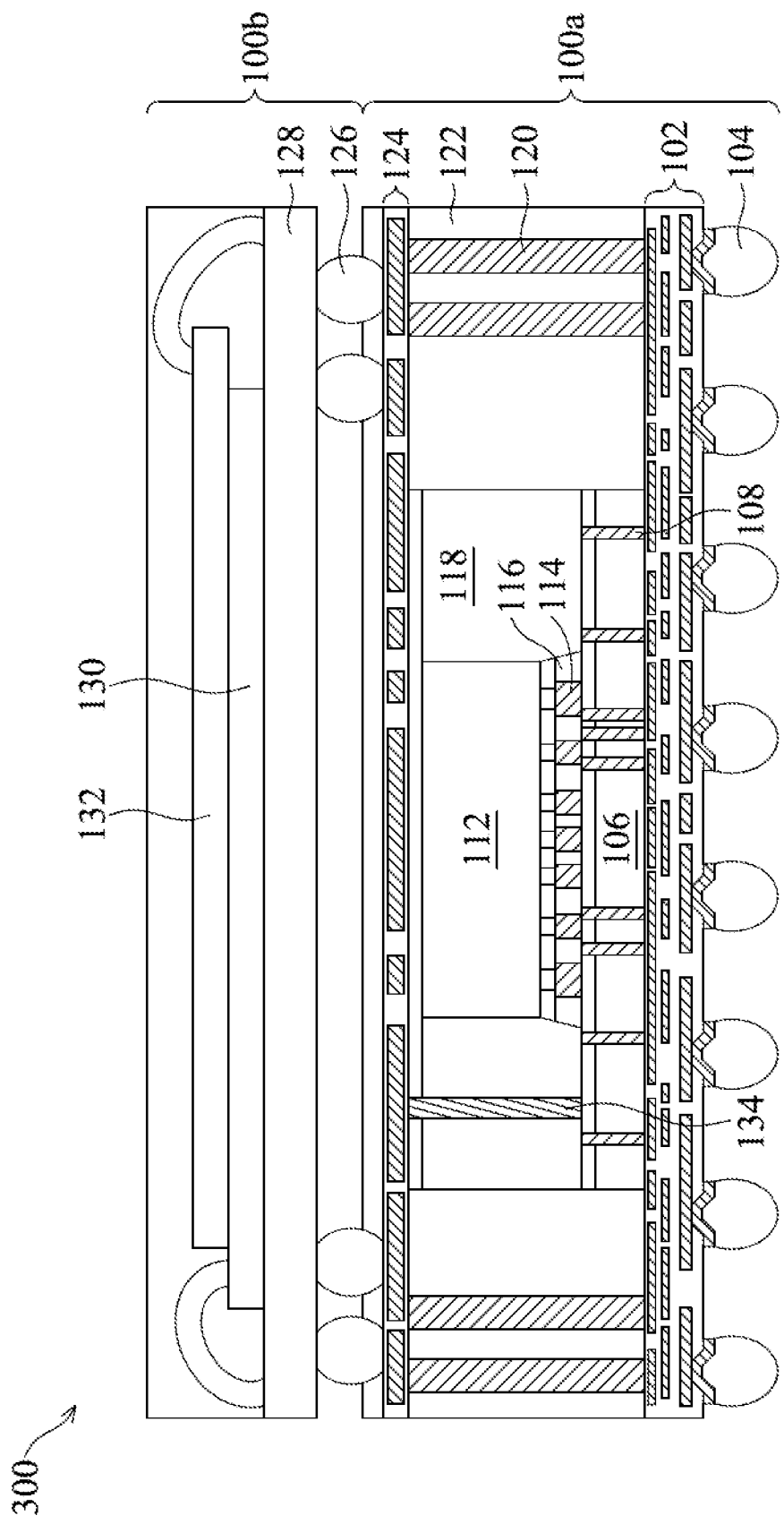
FIG. 3 is a cross-sectional view of an exemplary semiconductor package structure in accordance with some embodiments.

As shown in FIG. 3, the molding material 122 adjoins the sidewalls of the first semiconductor die 106 and the molding material 118, and covers the top surface of the first redistribution layer 102, the bottom surface of the second redistribution layer 124, the top surface and the bottom surface of the third redistribution layer 110. The molding material 122 may protect the stacking structure and the conductive pillars 120 from the environment, thereby preventing the stacking structure and the conductive pillars 120 from damage due to, for example, the stress, the chemicals and/or the moisture.

In some embodiments, the molding material 122 includes a nonconductive material, such as a moldable polymer, an epoxy, a resin, the like, or a combination thereof. In some embodiments, the molding material 122 is applied in liquid or semi-liquid form, and then is cured through any suitable curing process, such as a thermal curing process, a UV curing process, the like, or a combination thereof. The molding material 122 may be shaped or molded with a mold (not shown).

Then, the molding material 122 may be partially removed by a planarization process, such as chemical mechanical polishing (CMP), until the top surfaces of the conductive pillars 120 are exposed. In some embodiments, top surfaces of the molding material 122 and the conductive pillars 120 are substantially coplanar. As shown in FIG. 1, the sidewalls of the molding material 122 may be coplanar with at least one of the sidewalls of the first redistribution layer 102, the second redistribution layer 124, and the third redistribution layer 110.

As shown in FIG. 1, the second redistribution layer 124 may be disposed over the stacking structure, and may cover the top surface of the second semiconductor die 112, the top surface of the conductive pillars 120, and the top surface of the molding material 122.

As shown in FIG. 1, the second package structure 100b is disposed over the first package structure 100a and is electrically coupled to the second redistribution layer 124 through a plurality of conductive structures 126, in accordance with some embodiments. In some embodiments, the conductive structures 126 include conductive materials, such as metal. The conductive structures 126 may include microbumps, controlled collapse chip connection (C4) bumps, ball grid array (BGA) balls, the like, or a combination thereof.

As shown in FIG. 1, the second package structure 100b includes a substrate 128, in accordance with some embodiments. The substrate 128 may have a wiring structure therein. In some embodiments, the wiring structure of the substrate 128 includes conductive layers, conductive vias, conductive pillars, the like, or a combination thereof. The wiring structure of the substrate 128 may be formed of metal, such as copper, titanium, tungsten, aluminum, the like, or a combination thereof.

The wiring structure of the substrate 128 may be disposed in inter-metal dielectric (IMD) layers. In some embodiments, the IMD layers may be formed of organic materials, such as a polymer base material, a non-organic material, such as silicon nitride, silicon oxide, silicon oxynitride, the like, or a combination thereof. Any desired semiconductor element may be formed in and on the substrate 128. However, in order to simplify the diagram, only the flat substrate 128 is illustrated.

As shown in FIG. 1, the second package structure 100b includes semiconductor components 130 and 132 over substrate 128, in accordance with some embodiments. The semiconductor components 130 and 132 may include memory dies, such as a dynamic random access memory (DRAM). The semiconductor components 130 and 132 may be double data rate (DDR) synchronous dynamic random access memory (SDRAM) dies for use in a mobile system, for example. In the embodiments where the second package structure 100b includes a memory device, the IP core for the second package structure 100b (such as the first IP core 101) may be referred to as the memory IP core.

The semiconductor components 130 and 132 may include the same or different devices. In some embodiments, the second package structure 100b also includes one or more passive components (not illustrated), such as resistors, capacitors, inductors, the like, or a combination thereof.

The first IP core 101 (as shown in FIGS. 2A-2D) in the stacking structure may be electrically coupled to the second package structure 100b through a first routing channel which includes the third redistribution layer 110, the conductive pillars 120, and the second redistribution layer 124. The second IP core 103 (as shown in FIGS. 2A-2D) in the stacking structure may be electrically coupled to the conductive structure 104 through a second routing channel which includes the first redistribution layer 110. In some embodiments, depending on the position of the IP cores, as described above, the first routing channel or the second routing channel may further include the through vias 108 in the first semiconductor die 106 and/or the conductive structures 114.

In other words, the routing channel between the IP core and the second package structure 100b may be separated from the other routing channels, such as the routing channel between another IP core and the conductive structure 104. In particular, the routing channel between the IP core and the second package structure 100b is electrically insulated from the first redistribution layer 110 according to some embodiments. As a result, different routing channels can be optimized separately, and the channel design flexibility can be increased.

FIG. 3 is a cross-sectional view of a semiconductor package structure 300 in accordance with some embodiments of the disclosure. It should be noted that the semiconductor package structure 300 may include the same or similar components as that of the semiconductor package structure 100 shown in FIG. 1, and for the sake of simplicity, those components will not be discussed in detail again. In the following embodiments, the routing channel includes a conductive pillar 134 over the first semiconductor die 106 and adjacent to the second semiconductor die 112.

The conductive pillar 134 is electrically coupled to the second redistribution layer 124, the first semiconductor die 106, and the through vias 108 in the first semiconductor die 106, according to some embodiments. In the embodiments where the IP core for the second package structure 100b is formed on the bottom of the first semiconductor die 106, the routing channel between the IP core and the second package structure 100b may include the through vias 108 in the first semiconductor die 106, the conductive pillar 134, and the second redistribution layer 124. In the embodiments where the IP core for the second package structure 100b is formed on the top of the first semiconductor die 106, the routing channel between the IP core and the second package structure 100b may include the conductive pillar 134 and the second redistribution layer 124.

The conductive pillar 134 may include a metal pillar, such as a copper pillar. In some embodiments, the conductive pillar 134 is formed by a plating process or any other suitable process. The conductive pillar 134 may have substantially vertical sidewalls. As shown in FIG. 3, the conductive pillar 134 may be surrounded by the molding material 118. The conductive pillar 134 may have substantially vertical sidewalls and may extend from the bottom surface of the molding material 118 to the top surface of the molding material 118.

The positions and the numbers of the conductive pillar 134 may be adjusted according to the routing design of the first package structure 100a. For example, more than one conductive pillar 134 may be disposed over the first semiconductor die 106, and may be disposed adjacent to one side or opposite sides of the semiconductor die 112. In addition, the semiconductor package structure 300 may further include one or more redistribution layers, such as the third redistribution layer 110 in FIG. 1.

Figure 4:
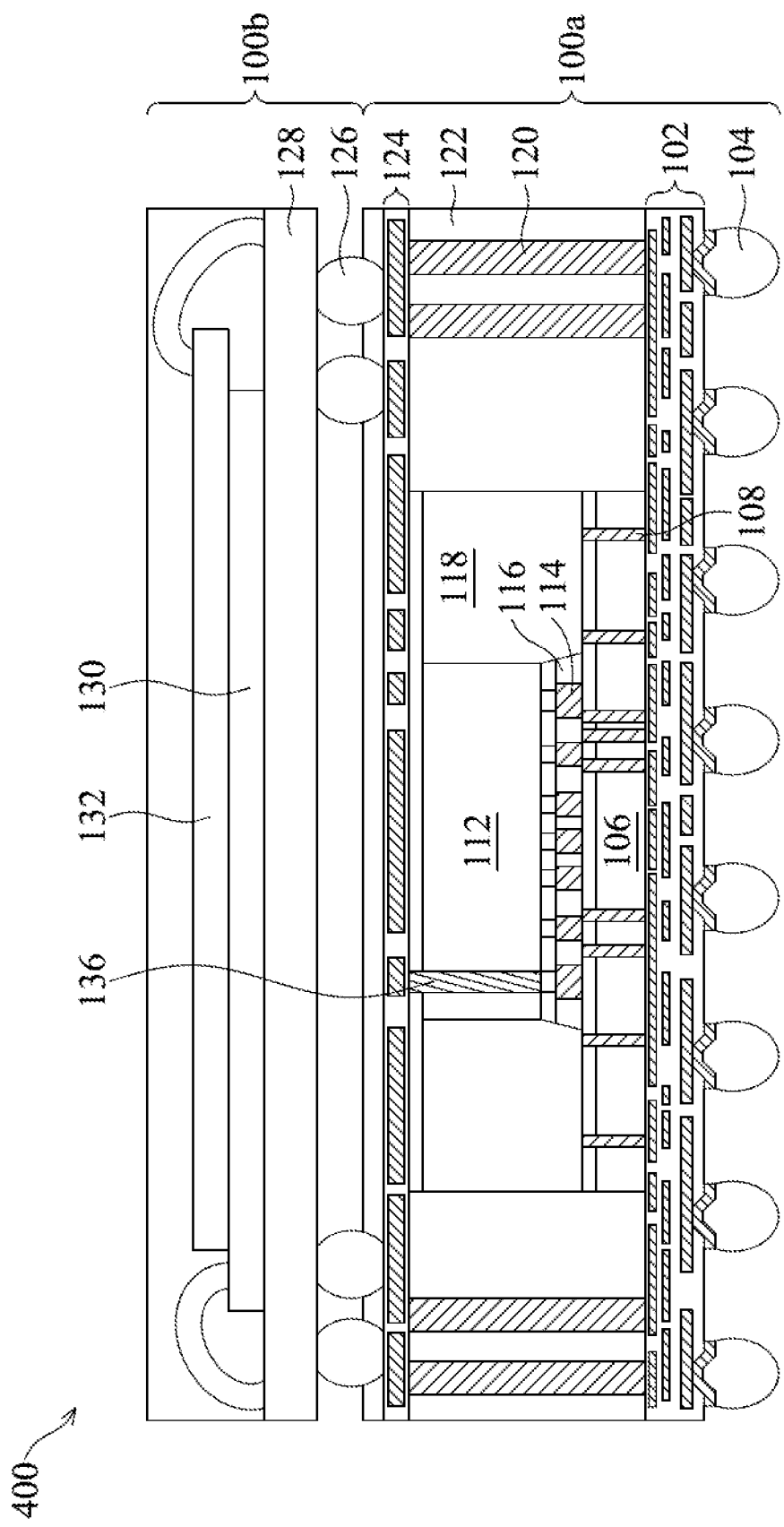
FIG. 4 is a cross-sectional view of an exemplary semiconductor package structure in accordance with some embodiments.

FIG. 4 is a cross-sectional view of a semiconductor package structure 400 in accordance with some embodiments of the disclosure. It should be noted that the semiconductor package structure 400 may include the same or similar components as that of the semiconductor package structure 100 shown in FIG. 1, and for the sake of simplicity, those components will not be discussed in detail again. In the following embodiments, the routing channel includes a through via 136 in the second semiconductor die 112.

The through via 136 may be electrically coupled to the second redistribution layer 124, the conductive structures 114, the first semiconductor die 106, and the through vias 108 in the first semiconductor die 106. In the embodiments where the IP core for the second package structure 100b is formed on the bottom of the first semiconductor die 106, the routing channel between the IP core and the second package structure 100b may include the through vias 108 in the first semiconductor die 106, the conductive structures 114, the through via 136, and the second redistribution layer 124. In the embodiments where the IP core for the second package structure 100b is formed on the top of the first semiconductor die 106, the routing channel between the IP core and the second package structure 100b may include the conductive structures 114, the through via 136, and the second redistribution layer 124.

In the embodiments where the IP core for the second package structure 100b is formed on the bottom of the second semiconductor die 112, the routing channel between the IP core and the second package structure 100b may include the through via 136 and the second redistribution layer 124. In the embodiments where the IP core for the second package structure 100b is formed on the top of the second semiconductor die 112, the routing channel between the IP core and the second package structure 100b may include the second redistribution layer 124, and the through via 136 may be omitted.

In these embodiments, the routing channel between the second redistribution layer 124 and the IP core does not extend outside the first semiconductor die 106 and the second semiconductor die 112. In particular, the routing channel between the second redistribution layer 124 and the IP core passes the region shielded by the first semiconductor die 106 and/or the second semiconductor die 112.

The through via 136 may be formed of any conductive material, such as a metal. For example, the through via 136 is formed of copper. As shown in FIG. 4, the through via 136 may have substantially vertical sidewalls and may extend from the top surface of the second semiconductor die 112 to the bottom surface of the second semiconductor die 112, but the present disclosure is not limit thereto. The through via 136 in the second semiconductor die 112 may have other configurations.

The positions and the numbers of the through via 136 may be adjusted according to the routing design of the first package structure 100a. For example, more than one through via 136 may be disposed in the second semiconductor die 112. Alternatively, the semiconductor package structure 400 may further include one or more redistribution layers (such as the third redistribution layer 110 in FIG. 1) and/or one or more conductive pillars (such as the conductive pillar 134 in FIG. 3).

Figure 5:
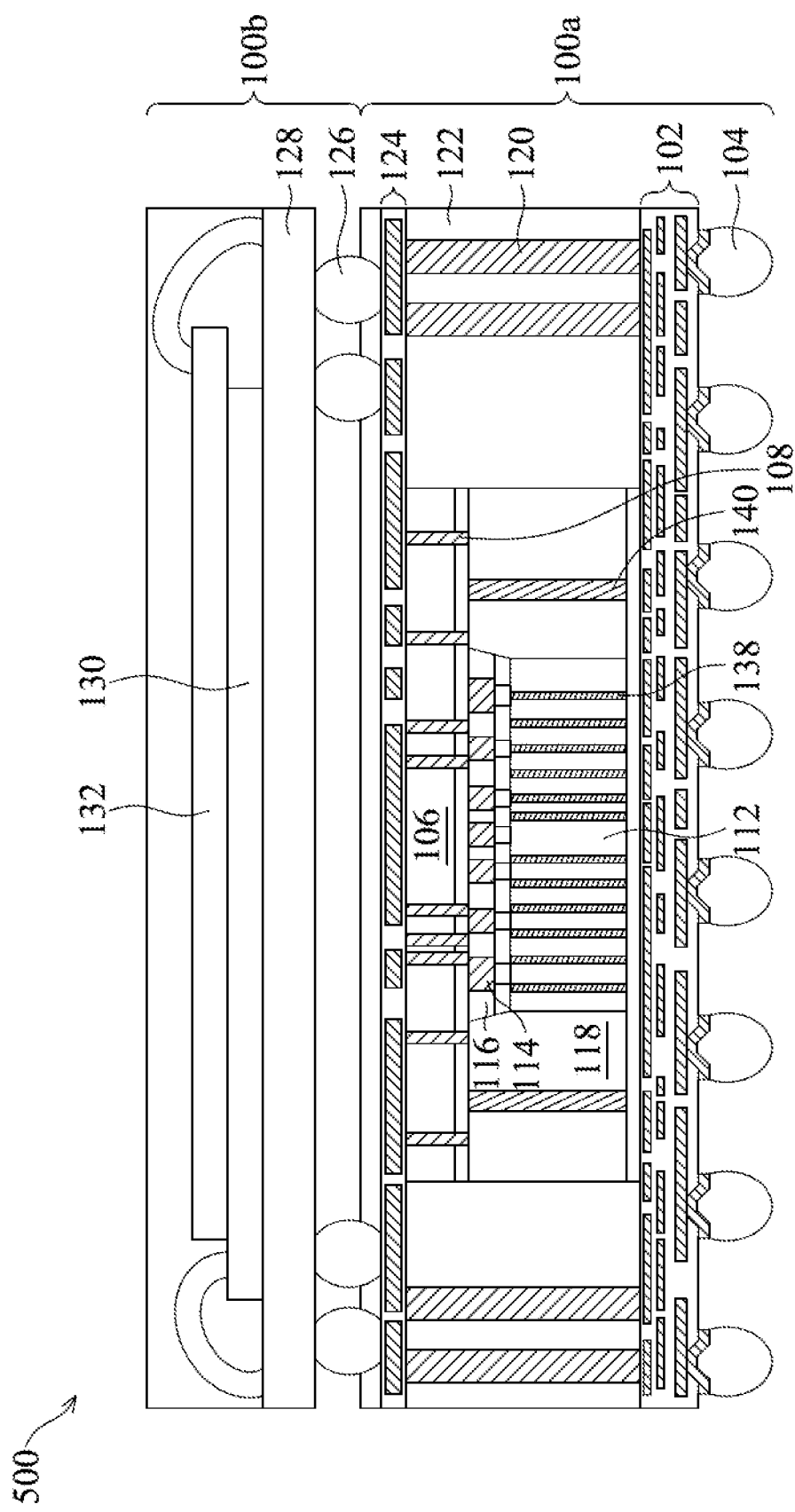
FIG. 5 is a cross-sectional view of an exemplary semiconductor package structure in accordance with some embodiments.

FIG. 5 is a cross-sectional view of a semiconductor package structure 500 in accordance with some embodiments of the disclosure. It should be noted that the semiconductor package structure 500 may include the same or similar components as that of the semiconductor package structure 100 shown in FIG. 1, and for the sake of simplicity, those components will not be discussed in detail again. In the following embodiments, the larger first semiconductor die 106 is disposed over the smaller second semiconductor die 112.

As shown in FIG. 5, the second semiconductor die 112 may include a plurality of through vias 138, which may be electrically coupled to the first redistribution layer 102, the conductive structures 114, and the through vias 108 in the first semiconductor die 106. The through vias 138 may be formed of any conductive material, such as a metal. For example, the through vias 138 may be formed of copper. As shown in FIG. 1, the through vias 138 may each have substantially vertical sidewalls and may extend from the top surface of the second semiconductor die 112 to the bottom surface of the second semiconductor die 112. However, the through vias 138 in the second semiconductor die 112 may have other configurations and numbers.

The through vias 138 may be electrically coupled to the first redistribution layer 102, the conductive structures 114, the first semiconductor die 106, and the through vias 108 in the first semiconductor die 106. In the embodiments where the IP core for the second package structure 100b is formed on the bottom of the second semiconductor die 112, the routing channel between the IP core and the second package structure 100b may include the through vias 138 in the second semiconductor die 112, the conductive structures 114, the through vias 108 in the first semiconductor die 106, and the second redistribution layer 124. In the embodiments where the IP core for the second package structure 100b is formed on the top of the second semiconductor die 112, the routing channel between the IP core and the second package structure 100b may include the conductive structures 114, the through vias 108 in the first semiconductor die 106, and the second redistribution layer 124.

In the embodiments where the IP core for the second package structure 100b is formed on the bottom of the first semiconductor die 106, the routing channel between the IP core and the second package structure 100b may include the through vias 108 in the first semiconductor die 106 and the second redistribution layer 124. In the embodiments where the IP core for the second package structure 100b is formed on the top of the first semiconductor die 106, the routing channel between the IP core and the second package structure 100b may include the second redistribution layer 124, and the through vias 108 may be omitted.

In these embodiments, the routing channel between the second redistribution layer 124 and the IP core does not extend outside the first semiconductor die 106 and the second semiconductor die 112. In particular, the routing channel between the second redistribution layer 124 and the IP core passes the region shielded by the first semiconductor die 106 and/or the second semiconductor die 112.

As shown in FIG. 5, the first package structure 100a may include one or more conductive pillars 140 below the first semiconductor die 106 and adjacent to the second semiconductor die 112. The conductive pillars 140 are optional. The conductive pillars 140 may include metal pillars, such as copper pillars. In some embodiments, the conductive pillars 140 are formed by a plating process or any other suitable process.

The conductive pillars 140 may be electrically coupled to the first redistribution layer 102, the first semiconductor die 106, and the through vias 108 of the first semiconductor die 106. As shown in FIG. 5, each of the conductive pillars 140 may have substantially vertical sidewalls. The conductive pillars 140 may be surrounded by the molding material 108 and extend from the top surface of the molding material 108 to the bottom surface of the molding material 108.

The positions and the numbers of the conductive pillars 140 may be adjusted according to the routing design of the first package structure 100a. As shown in FIG. 5, two conductive pillars 140 are disposed adjacent to opposite sides of the second semiconductor die 112, but the present disclosure is not limit thereto. For example, the number of conductive pillars 140 may be different on opposite sides of the stacking structure. Alternatively, the conductive pillars 140 may be disposed on one side of the stacking structure.

Figure 6:
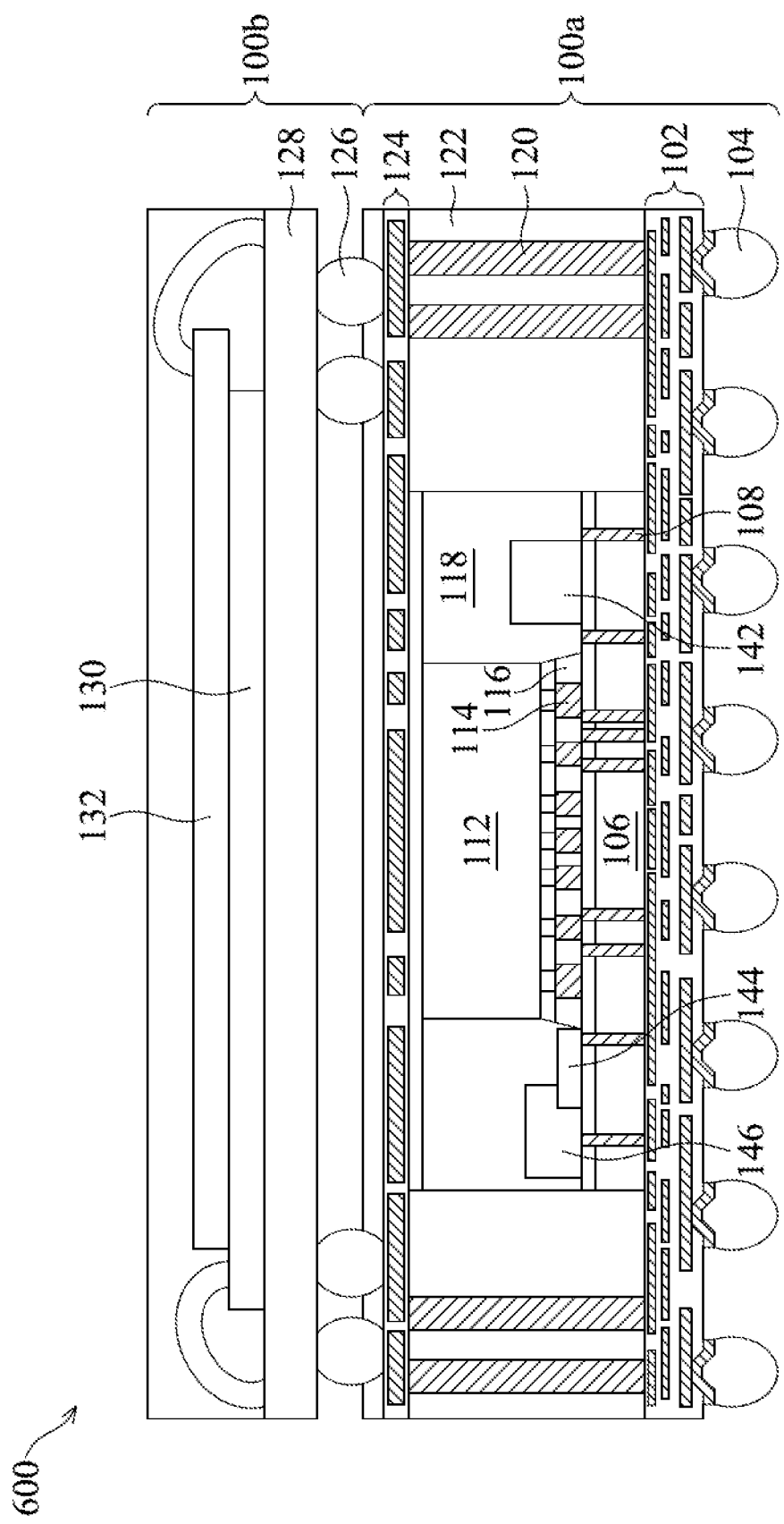
FIG. 6 is a cross-sectional view of an exemplary semiconductor package structure in accordance with some embodiments.

FIG. 6 is a cross-sectional view of a semiconductor package structure 600 in accordance with some embodiments of the disclosure. It should be noted that the semiconductor package structure 600 may include the same or similar components as that of the semiconductor package structure 100 shown in FIG. 1, and for the sake of simplicity, those components will not be discussed in detail again. In the following embodiments, the stacking structure includes a plurality of semiconductor components 142, 144, 146 over the first semiconductor die 106 and adjacent to the second semiconductor die 112.

The semiconductor components 142, 144, 146 may include active components. For example, the semiconductor components 142, 144, 146 may each independently include a system-on-chip (SoC) die, a logic device, a memory device, a radio frequency (RF) device, the like, or any combination thereof. For example, the semiconductor components 142, 144, 146 may each independently include a micro control unit (MCU) die, a micro processor unit (MPU) die, a power management integrated circuit (PMIC) die, a global positioning system (GPS) device, a central processing unit (CPU) die, a graphics processing unit (GPU) die, an input-output (IO) die, a dynamic random access memory (DRAM) IP core, a static random-access memory (SRAM), a high bandwidth memory (HBM), the like, or any combination thereof.

In some other embodiments, the semiconductor components 142, 144, 146 include passive components, such as resistors, capacitors, inductors, the like, or a combination thereof. The semiconductor components 142, 144, 146 may include the same or different devices.

The semiconductor components 142, 144, 146 may be electrically coupled to the first semiconductor die 106. Each of the semiconductor components 142, 144, 146 may be surrounded and covered by the molding material 108. It should be noted that the number and the positions of the semiconductor components 142, 144, 146, the first semiconductor die 106, and the second semiconductor die 112 are illustrative only, and the present disclosure is not limit thereto.

For example, the semiconductor components 142, 144, 146 may be stacked vertically. Alternatively, the stacking structure may include two semiconductor components which are stacked vertically. In some other embodiments, the stacking structure may include four semiconductor components, wherein two of them are stacked vertically over a semiconductor component, and the other semiconductor component is disposed over the semiconductor component and adjacent to the two semiconductor components.

Depending on the routing design of the first package structure 100a, the semiconductor package structure 600 may further include one or more redistribution layers (such as the third redistribution layer 110 in FIG. 1), one or more conductive pillars (such as the conductive pillar 134 in FIG. 3), and/or one or more through vias in semiconductor dies (such as the through via 136 in FIG. 4).

Figure 7:
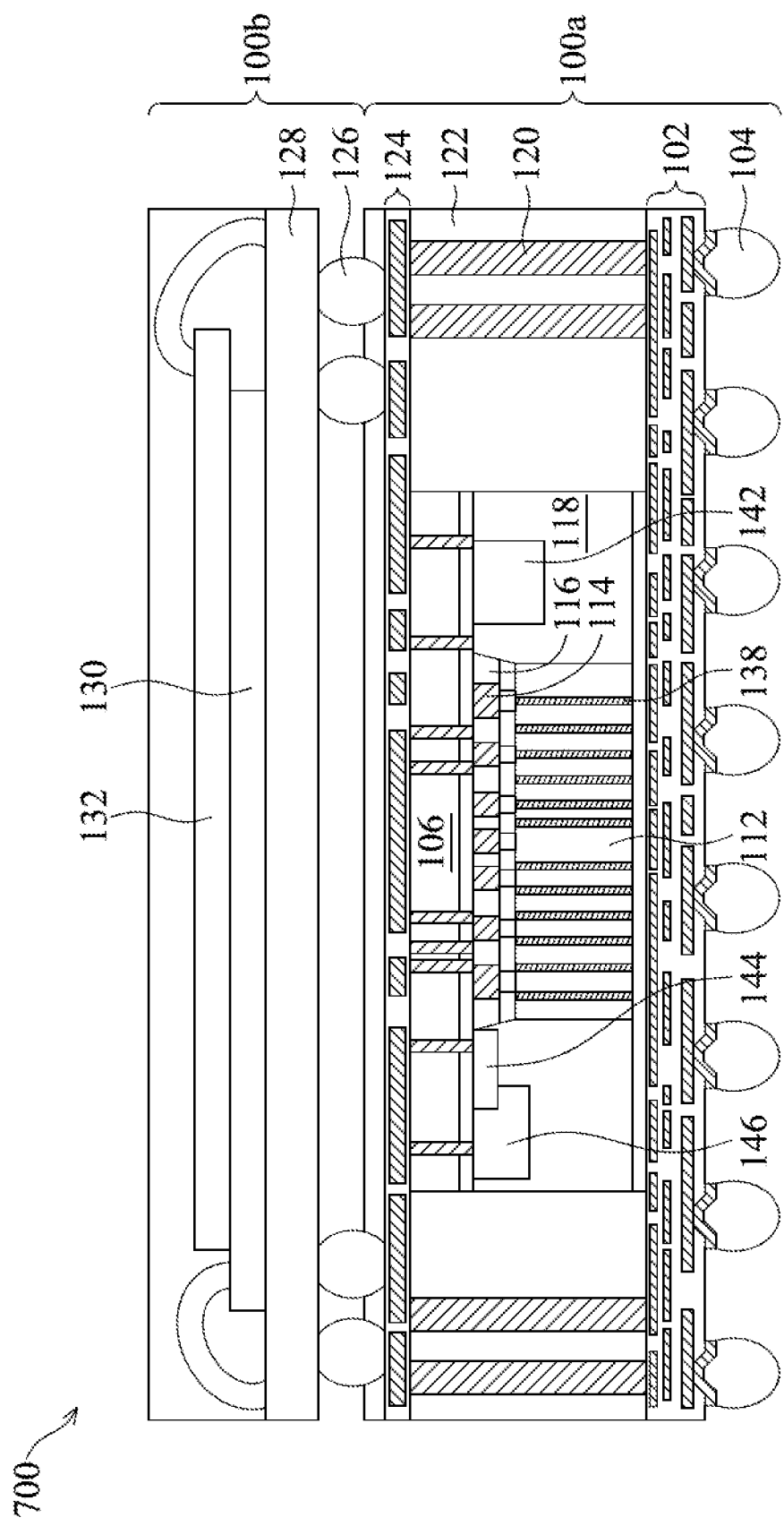
FIG. 7 is a cross-sectional view of an exemplary semiconductor package structure in accordance with some embodiments.

FIG. 7 is a cross-sectional view of a semiconductor package structure 700 in accordance with some embodiments of the disclosure. It should be noted that the semiconductor package structure 700 may include the same or similar components as that of the semiconductor package structure 600 shown in FIG. 6, and for the sake of simplicity, those components will not be discussed in detail again. In the following embodiments, the stacking structure includes a plurality of semiconductor components 142, 144, 146 below the first semiconductor die 106 and adjacent to the second semiconductor die 112.

The semiconductor components 142, 144, 146 may be similar to the semiconductor components 142, 144, 146 in FIG. 6, and will not be repeated. The semiconductor components 142, 144, 146 may be electrically coupled to the first semiconductor die 106. Each of the semiconductor components 142, 144, 146 may be surrounded and covered by the molding material 108. It should be noted that the number and the positions of the semiconductor components 142, 144, 146, the first semiconductor die 106, and the second semiconductor die 112 are illustrative only, and the present disclosure is not limit thereto.

For example, the semiconductor components 142, 144, 146 may be stacked vertically. Alternatively, the stacking structure may include two semiconductor components which are stacked vertically. In some other embodiments, the stacking structure may include four semiconductor components, wherein two of them are stacked vertically over a semiconductor component, and the other semiconductor component is disposed over the semiconductor component and adjacent to the two semiconductor components.

Depending on the routing design of the first package structure 100a, the semiconductor package structure 700 may further include one or more redistribution layers (such as the third redistribution layer 110 in FIG. 1), one or more conductive pillars (such as the conductive pillar 134 in FIG. 3), and/or one or more through vias in semiconductor dies (such as the through via 136 in FIG. 4).

In summary, by disposing one or more redistribution layers, one or more conductive pillars, and/or one or more through vias in semiconductor dies in a package structure, an individual routing channel for an IP core in the package structure to another package structure can be achieved. As a result, the routing channels can be optimized separately, and the channel design flexibility can be increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a frontside redistribution layer;
   a stacking structure disposed over the frontside redistribution layer and comprising a first semiconductor die and a second semiconductor die over the first semiconductor die;
   a backside redistribution layer disposed over the stacking structure;
   a first intellectual property (IP) core disposed in the stacking structure and electrically coupled to the frontside redistribution layer through a first routing channel;
   a second IP core disposed in the stacking structure and electrically coupled to the backside redistribution layer through a second routing channel, wherein the second routing channel is different from the first routing channel and electrically insulated from the frontside redistribution layer;
   a first conductive pillar disposed between the backside redistribution layer and the first semiconductor die;
   a first molding material disposed between the backside redistribution layer and the first semiconductor die, wherein a sidewall of the first molding material is coplanar with a sidewall of the first semiconductor die; and
   a second molding material disposed between the frontside redistribution layer and the backside redistribution layer and surrounding the first molding material and the first semiconductor die.

2. The semiconductor package structure as claimed in claim 1, further comprising a package structure disposed over the backside redistribution layer and electrically coupled to the second IP core through the second routing channel.

3. The semiconductor package structure as claimed in claim 1, wherein the second routing channel comprises:
   the first conductive pillar adjacent to the stacking structure and electrically coupled to the backside redistribution layer; and
   a redistribution layer between a top surface of the first semiconductor die and a bottom surface of the second semiconductor die and electrically coupled to the first conductive pillar.

4. The semiconductor package structure as claimed in claim 3, wherein the second routing channel further comprises a plurality of through vias in the first semiconductor die.

5. The semiconductor package structure as claimed in claim 3, wherein the first molding material surrounds the first conductive pillar and the stacking structure, wherein the sidewall of the first molding material is coplanar with a sidewall of the redistribution layer.

6. The semiconductor package structure as claimed in claim 1, wherein the first conductive pillar is disposed over the first semiconductor die and adjacent to the second semiconductor die.

7. The semiconductor package structure as claimed in claim 6, wherein the first molding material surrounds the first conductive pillar and the second semiconductor die.

8. The semiconductor package structure as claimed in claim 6, wherein the second routing channel further comprises a through via in the first semiconductor die.

9. The semiconductor package structure as claimed in claim 1, wherein the second routing channel comprises a first through via in the second semiconductor die.

10. The semiconductor package structure as claimed in claim 9, wherein the second routing channel further comprises a second through via in the first semiconductor die.

11. The semiconductor package structure as claimed in claim 1, further comprising a second conductive pillar disposed below the second semiconductor die and adjacent to the first semiconductor die, wherein the second conductive pillar electrically couples the second semiconductor die to the frontside redistribution layer.

12. The semiconductor package structure as claimed in claim 1, wherein the second routing channel passes a region shielded by the first semiconductor die and/or the second semiconductor die.

13. A semiconductor routing structure, comprising:
a first package structure having a frontside and a backside and comprising a stacking structure having a first intellectual property (IP) core and a second IP core, wherein the stacking structure comprises a first semiconductor die and a second semiconductor die over the first semiconductor die;
a first routing channel electrically coupling the first IP core to a first redistribution layer on the frontside of the first package structure;
a second routing channel independently and electrically coupling the second IP core to a second redistribution layer on the backside of the first package structure, wherein the second routing channel is different from the first routing channel and electrically insulated from the first redistribution layer, wherein the first routing channel or the second routing channel comprises a first conductive pillar disposed between the first redistribution layer and the second semiconductor die;
a first molding material disposed between the first redistribution layer and the second semiconductor die, wherein a sidewall of the first molding material is coplanar with a sidewall of the first semiconductor die; and
a second molding material disposed between the first redistribution layer and the second redistribution layer and surrounding the first molding material and the second semiconductor die.

14. The semiconductor routing structure as claimed in claim 13, further comprising a second package structure disposed on the second redistribution layer, wherein the second package structure receives a control signal from the second IP core through the second routing channel.

15. The semiconductor routing structure as claimed in claim 13, wherein the first IP core and the second IP core are each independently disposed in the first semiconductor die or the second semiconductor die.

16. The semiconductor routing structure as claimed in claim 15, wherein the second routing channel comprises a through via in the first semiconductor die and electrically coupling the second semiconductor die to the second redistribution layer.

17. The semiconductor routing structure as claimed in claim 15, wherein the second routing channel comprises the first conductive pillar adjacent to the first semiconductor die and electrically coupling the second semiconductor die to the second redistribution layer.

18. The semiconductor routing structure as claimed in claim 15, wherein the second routing channel comprises a third redistribution layer extending between the first semiconductor die and the second semiconductor die.

19. The semiconductor routing structure as claimed in claim 18, wherein the second routing channel comprises a second conductive pillar adjacent to the stacking structure and electrically coupled to the second redistribution layer and the third redistribution layer.

20. The semiconductor package structure as claimed in claim 1, wherein the first conductive pillar is in contact with the first semiconductor die.

* * * * *